US007009116B2

(12) United States Patent
Schmid et al.

(10) Patent No.: US 7,009,116 B2
(45) Date of Patent: Mar. 7, 2006

(54) CONTACT DEVICE AND A PROCESS TO FACILITATE CONTACT OF POWER ELECTRONICS COMPONENTS AND AN ASSEMBLY THAT CONSISTS OF ONE OR SEVERAL POWER ELECTRONICS COMPONENTS

(75) Inventors: Ralf Schmid, Kaltental (DE); Marco Schmidt, Munich (DE)

(73) Assignee: Conti Temic Microelectric, Nürnberg (DE)

( * ) Notice: Subject to any disclaimer, the term of this patent is extended or adjusted under 35 U.S.C. 154(b) by 360 days.

(21) Appl. No.: 10/306,291

(22) Filed: Nov. 27, 2002

(65) Prior Publication Data

US 2003/0168252 A1 Sep. 11, 2003

(30) Foreign Application Priority Data

Nov. 28, 2001 (EP) ................................. 01128251

(51) Int. Cl.
*H05K 1/16* (2006.01)

(52) U.S. Cl. ....................................... 174/260; 361/760

(58) Field of Classification Search ......... 257/660–670
See application file for complete search history.

(56) References Cited

U.S. PATENT DOCUMENTS

| | | | |
|---|---|---|---|
| 3,967,366 A | 7/1976 | Birglechner et al. | |
| 4,346,396 A | 8/1982 | Carroll, II et al. | |
| 4,809,054 A | 2/1989 | Waldner | |
| 5,173,842 A * | 12/1992 | Depew | 361/760 |
| 5,343,072 A * | 8/1994 | Imai et al. | 257/666 |
| 5,436,405 A * | 7/1995 | Hogge et al. | 174/35 R |
| 6,249,041 B1 * | 6/2001 | Kasem et al. | 257/666 |

FOREIGN PATENT DOCUMENTS

| | | |
|---|---|---|
| DE | 19 11 633 | 10/1969 |
| DE | 199 60 013 A1 | 6/2000 |
| DE | 199 33 975 A1 | 3/2001 |
| EP | 01057726 | 3/1989 |
| EP | 04098843 | 3/1992 |
| EP | 05102384 | 4/1993 |

* cited by examiner

*Primary Examiner*—Kamand Cuneo
*Assistant Examiner*—Yuriy Semenenko

(57) ABSTRACT

The invention is a process to facilitate contacting of one or several power electronics components (10) with strip conductors (14, 15) on a substrate (12, 18) with the aid of a contact device (1) with several flat contact elements (6, 8) that are connected to each other by means of bridges (4, 5), including the following steps: (a) the contact device (1) is set on the upper side of the component (10); (b) the underside of a contact element (6, 8) is electrically connected both with a contact surface (S, G) on the upper side of a component (10) and with a strip conductor (14, 15); (c) at least one of the bridges (4, 5) between the individual contact elements (6, 8) is severed by means of thermal gouging. The invention also includes an assembly (16, 16') produced with the process as well as a contact device (1) with several flat contact elements (6, 7) to facilitate contacting of power electronics components (10).

5 Claims, 7 Drawing Sheets

CONTACT DEVICE AND A PROCESS TO FACILITATE CONTACT OF POWER ELECTRONICS COMPONENTS AND AN ASSEMBLY THAT CONSISTS OF ONE OR SEVERAL POWER ELECTRONICS COMPONENTS

CROSS-REFERENCE TO RELATED APPLICATIONS

The present patent application claims priority from European Patent Application No. 01 128 251.4, filed on Nov. 28, 2001.

BACKGROUND TO THE INVENTION

The invention is a contact device and a process to facilitate contact of power electronics components as well as an assembly that consists of one or several power electronics components that are contacted with strip conductors on a carrier.

The current state of technology generally recognizes the following processes to facilitate contact of integrated electronic components (chips):

In the case of so-called Drahtbonden [wire bonding], a semiconductor component is placed onto a substrate, whereby fine gold or aluminum wires connect the components' metallic contact surfaces (bond pads) with the substrate's contacts. The fine gold or aluminum wires are fastened to the contact surfaces by means of ultrasound welding, for example. The serial nature of the contacting process makes wire bonding relatively time-intensive.

Therefore, industrial-scale production of microelectronic components also employs the so-called Tape Automated Bonding (TAB) method, whereby a copper comb, produced by means of etching on a plastic carrier (tape), is placed on the upper side of the component and simultaneously bonded by means of thermal compression with all contact surfaces on the component.

In addition, the so-called flip chip method is a common method whereby a chip is bonded directly with the substrate. Accordingly, so-called solder bumps are produced on the contact surfaces of the component's underside. When the entire substrate is warmed, these bumps become bonded with the substrate's strip conductors.

However, due to their small contact surfaces, for instance, these commonly-known methods of facilitating contact are not entirely suitable for applications where larger amounts of power will be transferred. While it is true that power electronics components, such as power MOSFETs, are generally bonded to a substrate's contacts by means of wire bonds, the high levels of current necessitate the use of several wires for each power contact (the source and drain of a MOSFET, for example). For this reason, the use of wire bonds to contact power electronics components is relatively time-consuming and expensive. Also, inductance of the bond wires can cause distortions of the signal at high frequencies.

In the past, power electronics components were generally not placed onto a substrate in an unencapsulated condition; instead, they were enclosed in a housing. For example, German patent DE-PS 19 11 633 reveals a method of contacting and enveloping semiconductor components whereby the component is assembled onto a stamped lead frame. Accordingly, the component, such as a high performance transistor (whose contact surfaces are covered with solder), is placed onto a plate-like portion of the lead frame and the ends of the lead frame's narrow lead bridges are placed onto the contact surfaces on the transistor's upper side. The frame and the component are then placed together into a pressing mold, the temperature is increased until the solder melts, and the press mold is later filled with a plastic material. Finally, parts of the lead frame, which protrude from the encapsulated component, are removed in order to electrically separate from each other the leads to the individual contacts.

U.S. Pat. No, 4,809,054 also demonstrates a method of contacting semiconductor elements with a lead frame. The contact surfaces arranged on the upper side and underside of the component are covered with solder, the component is placed onto a right-angle section of the lead frame, and another section of the lead frame is folded over in such a way that it contacts the contact surface on the upper side of the component.

German patent DE 199 33 975 is also mentioned. It describes a pressed screen for contacting the connections of an assembly that consists of several electronic parts.

The invention pursues the objective of providing a cost-effective system for contacting power electronics components with which mechanically and electrically stable and especially low-inductance connection paths to the component's contacts can nevertheless be created.

The invention achieves this objective by means of the methods and devices detailed in claims 1, 7, and 14. Preferred designs for executing the inventions are provided in the respectively subordinate claims, as well as other places.

SUMMARY OF THE INVENTION

Accordingly, the invention provides a method of contacting one or several power electronics components with strip conductors on a substrate. The method is executed with the aid of a contact device with several flat contact elements joined to each other with bridges and includes the following steps: (a) The contact device is placed onto the upper side of the component(s); (b) the underside of a contact element is electrically connected both with the contact surface on the upper side of a component and with a strip conductor; (c) at least one of the bridges between the individual contact elements is severed by means of thermal gouging.

Furthermore, the invention provides a contact device for contacting one or several power electronics components with strip conductors on a substrate. The contact device contains one or several flat contact elements, each of which is suitable for connecting a component's contact surface with a strip conductor. The contact device's individual contact elements are joined to each other via bridges that can be severed by means of laser cutting, electron beam cutting, and/or ion beam cutting.

Finally, the invention provides an assembly that includes one or several power electronics components that exhibit contact surfaces at least on their upper sides as well as a substrate with strip conductors on which the undersides of the components rest. The assembly also includes one or several flat contact elements for contacting the component(s) with the strip conductors, whereby each contact element is electrically connected with both a contact surface on the upper side of the component and with a strip conductor.

BRIEF DESCRIPTION OF THE DRAWINGS

The invention will now be more closely explained through the use of preferred design examples and the attached drawing. The figures in the drawing schematically depict the following.

DETAILED DESCRIPTION OF THE INVENTION

Figure 1:
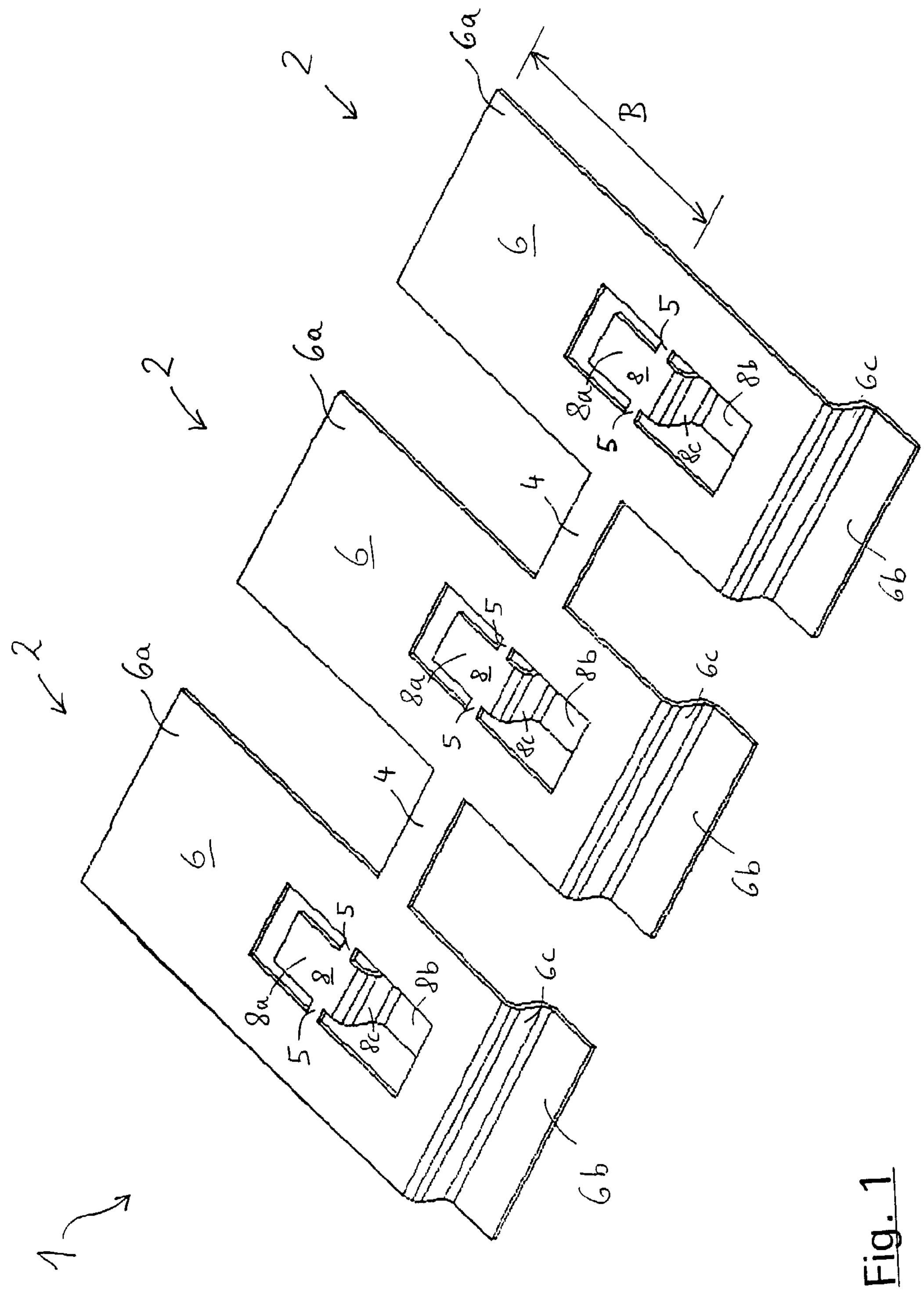
FIG. 1 A perspective view of a contact device according to an initial design example.

Parts with the same functions or similar functions are sometimes labeled in the drawing with the same reference symbol.

FIG. 1 shows an example of a contact device according to the invention. Before this figure and the other figures are explained in more detail, a few general remarks about the preferred design examples will be provided:

The term "strip conductor" refers in the following text to the contact area that is connected to a semiconductor component's (a chip's) metallic contact surfaces (so-called pads). In general, the metal strips are located on a chip substrate, although other designs are feasible.

The flatness of the contact elements according to the invention ensures that the inductance of the connection paths between the component and the strip conductors will be minimal, a particularly advantageous characteristic in high-frequency applications. Furthermore, the correspondingly large connection surfaces result in minimal contact resistance and, therefore, a comparably small increase in the temperature of the component, especially in applications that involve high amounts of current. In contrast to the wire bond method, for example, special contact surfaces are not required for contacting because the electrical connections can be established with a simple process like soldering or bonding.

The design examples according to the invention employ a contact device that consists of several flat contact elements that during assembly are still joined together by bridges so that the contact elements can be placed together onto the component(s) that will be contacted. After the electrical connections have been established, the preferred method is to sever at least one of the bridges in order to electrically separate the respective contact elements from each other. The preferred means of separation is a thermal gouging process, which—in contrast to many mechanical separation procedures like punching, for example—requires access to the point of separation from only one side. This means that a solid substrate, such as a substrate plate, can be located underneath the component.

A contactless thermal gouging process is preferred; this method has the advantage that no mechanical forces are transferred during separation of the bridge and therefore no mechanical stresses can develop in the contact device or the component. For example, a laser beam will be focused onto the contact device and the substrate, together with the components, will be moved in the desired cutting direction of the laser. Laser cutting enables precise dosing of the energy mass applied to the cutting location and the creation of accurately defined cut edges.

In the design examples, at least one component exhibits on its underside a contact surface that is placed onto and electrically connected with a strip conductor. Direct contacting with the strip conductor has the advantage of a particularly short connection path and is especially well suited for components, such as vertical MOSFET power transistors, that are erected by means of vertical engineering whereby either the source of drain contact is arranged on the underside of the transistor chip. These types of components must be contact from both sides.

In the preferred design examples, all electrical connections, possibly including the above-mentioned connection between the underside of a component and a strip conductor, are produced in one work step. This results in considerable cost savings when compared to the serial wire bonding method. The electrical connections are preferably produced by means of a so-called reflow soldering process. Accordingly, the solder is usually deposited onto the contact device and possibly the strip conductors by means of soldering paste printing, such as screen printing; the components are then set onto the strip conductors and the contact device is set onto the component, which is made easier by means of the soldering paste's adhesive properties. Alternatively, the soldering paste can be deposited onto the component itself. Finally, the solder is melted by means of a simultaneous soldering process such as in a continuous furnace or by means of vapor-phase soldering. In the case of vapor phase soldering, the prepared assembly is brought into a zone with hot, saturated vapor, whereby the vapor that condenses on the colder assembly releases the heat energy needed to melt the solder. Alternatively, single soldering processes may be used. These include stamp soldering or laser soldering or any other soldering and bonding process.

The contact device depicted in the preferred design examples is manufactured from a stamped or a stamp and bent component. The starting material is a thin copper sheet with a thickness of 100 to 500 $\mu$m from which a grid-like arrangement of contact elements, connected to each other by bridges, is stamped. If needed, the contact device is bent in a few areas in order to adapt it to the shape of component.

The sections of the contact elements that are intended to contact the component's contact surfaces are adapted to the shape and/or the size of the corresponding contact surface. In particular, the contact elements for the power contacts (such as the source or drain of a MOSFET) completely cover the component's corresponding power contact surfaces so that it is possible to establish with the contact element an electrical connection across the entire contact surface, thereby keeping the contact resistance low.

The contact elements for the control contacts (such as the gate of a MOSFET) preferably exhibit a smaller cross section than that of the power contacts (In other words, the current between the strip conductor and the contact surface has access to a lead with a smaller cross section) and are preferably each arranged in the recess of a contact element for a power contact. This arrangement is especially advantageous for the contacting of components where the control contact is also arranged in a recess of the power contact, such as is the case with currently available power MOSFETs. This also results in a compact arrangement of all contact elements for a component.

The contact device depicted in the preferred design example exhibits positioning aids that facilitate the positioning of the contact device on the component(s) and/or on the substrate. This initially makes it easier to align the contact device or the components on the substrate during setting and also serves to prevent slippage of the contact device during the preferred simultaneous reflow soldering process. Otherwise, simultaneous heating of all connection points would encourage the contact device and the components to "swim" on top of the contact surface's liquid solder, thereby easily slipping out of position. A spring is preferred as an alternative or addition to the positioning aids. The spring elastically presses the contact device against the component(s) and/or against the substrate, thereby preventing slippage.

According to an initial design example, the component and strip conductor substrate is a plate made of epoxy resin or ceramic, for example. The ceramic substrate made of, for example, $Al_2O_3$ or AlN is laminated with a copper layer in which the strip conductors are etched by means of a photolithographic process. The underside of the substrate is also coated with copper in order to avoid asymmetrical expansion of the substrate layers during warming. Ceramic is a good insulator and thermally very stable, but has high thermal resistance and therefore contributes almost nothing to dissipation of the component's waste heat. For this reason, a second design example uses as substrate a plastic frame that is injection-molded around the strip conductors. The strips conductors are thereby hung essentially bare, making them easy to cool. In the particularly preferred design examples, the plastic frame is hung in a container with a cooling medium.

The completed assembly is employed preferably as a half bridge or inverter for a three-phase motor. The assembly depicted in the design examples exhibits particular advantages when used with crankshaft starter generators because the flat electrical connections exhibit a large amount of mechanical stability and are therefore capable of withstanding the strain of shaking that occurs in motor vehicles. It is preferable for both power components (like power MOSFETs/diodes) as well as logic components (for activating the power electronics) to be arranged on a single substrate and thereby in a single assembly.

Returning to the figures, FIG. 1 shows a perspective view of a contact device 1 for the contacting 1 of three components, each with two contact surfaces on the upper side, for example three vertical MOSFETs with source and gate contacts on the upper side. A configuration consisting of two contact elements 6, 8 for contacting a component is labeled with numeral 2. The flat contact elements 6, 8 each exhibit section 6*a* or 8*a* for connection with the component's contact surfaces and section 6*b* or 8*b* for connection with the strip conductors. In the finished assembly, the components are arranged under the sections 6*a*, 8*a* in area B; the strip conductors are arranged under the sections 6*b*, 8*b*. The solder for creating the electrical connections may be deposited before assembly on the underside (not shown) of these sections. The sections 6*a*, 8*a* and 6*b*, 6*c* run parallel to each other and to the strip conductors. In the areas 6*c*, 8*c* lying between these sections, contact element 6 or 8 is bent in steps in order to bridge the height difference between the strip conductors and the upper side of the component. In some design examples (not shown), the steps are bent in the shape of the letter "S" or the letter "Z", making the areas 6*c*, 8*c* act as a spring. This spring action is used to press during the reflow soldering process, such as through a soldering template, contact element 1 onto the strip conductors and thereby counteract slippage of the contact device 1 and the components across the strip conductors.

The contact elements 6, 8 are connected with each other by thin bridges 5 that are then severed by means of one of the above-mentioned thermal gouging processes after contacting of the components in order to electrically isolate the leads 6, 8 from each other. The wider bridges 4 between the contact elements 6 can also be severed after contacting of the components. However, this is not necessary if the three components, contacted by means of the shown contact device 1, are parallel connected.

Due to the fact that only a small control voltage flows through contact element 8, which contacts the gate electrode, while a greater current of 10–25 amperes (switched by the power component) flows through contact element 6, contact element 8 is narrower than contact element 6 and therefore exhibits a smaller cross section surface. The connection area 8*a* is also smaller than that of contact element 6. In addition, contact element 8 is located in a central recess of contact element 6 so that all contact elements for a component are arranged in a compact area. In other design examples (not shown), the recess is arranged at the edge of contact element 6.

Figure 2:
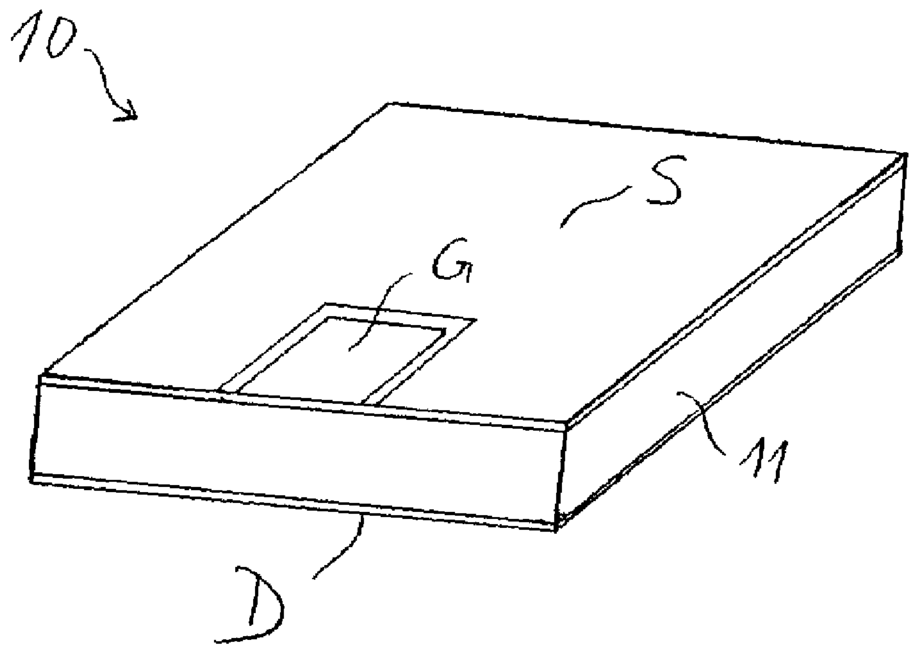
FIG. 2 A perspective view of a power electronics component that will be contacted.

FIG. 2 shows a component 10 that is contacted by means of the contact device 1. For use as an example, a power MOSFET in a semiconductor body 11, on which metallic contact surfaces for the gate (G), source (S), and drain (D) connections are placed, was chosen. The depicted example is a vertical MOSFET so that the drain contact surface (D) is located on the underside of the transistor plate and the gate and source contact surfaces G, S are located on the upper side. The gate contact surface is significantly smaller than the source contact surface and is arranged in a recess of the source contact surface. By comparing this figure with FIG. 1, it becomes clear that the sections 6*a*, 8*a* of the depicted contact elements 6, 8 approximately correspond in shape and size to the metallic source and gate contact surfaces S, G of transistor 10.

Figure 3:
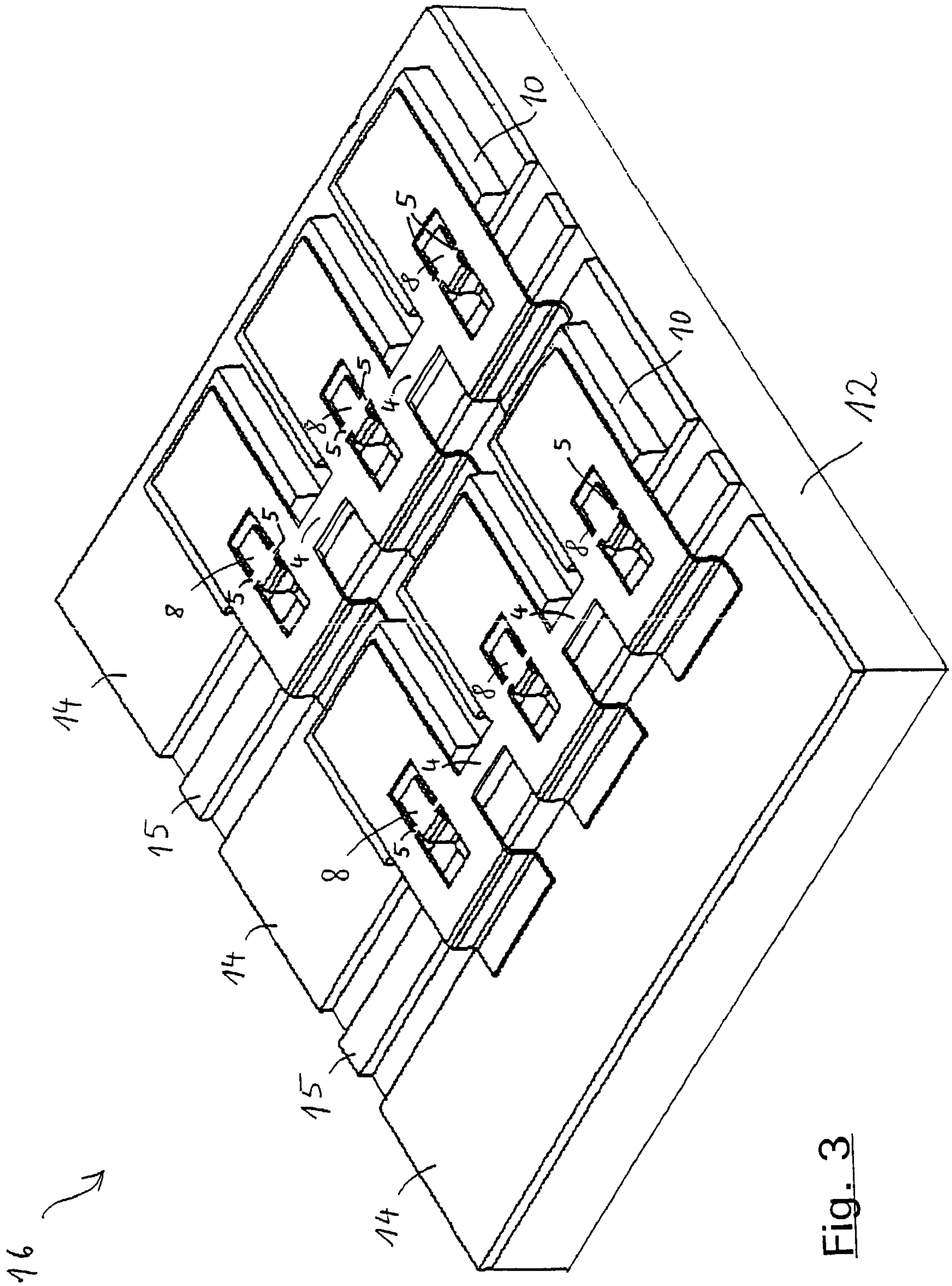
FIG. 3 A perspective view of an assembly according to an initial design example.

FIG. 3 shows an arrangement 16 of six of these types of components 10 and two contact devices 1 from FIG. 1 on a substrate plate 12. The substrate plate 12 consists, for example, of copper-coated ceramic. The wider strip conductors 14 facilitate the contacting of the power contacts while the narrower strip conductors 15 conduct the control signals.

The components 10 lie with each of their undersides on a strip conductor 14 so that the drain contact D can be contacted directly with this strip conductor by means of reflow soldering, for example.

FIG. 3 shows the assembly 6 after the contact devices 1 have been set, but before severing of the bridges 5 and 4, respectively. It cannot be determined by looking at assembly 16 whether the electrical connections have already been established because the connection points all lie under the sections 6*a*, 8*a*, and 6*b*, 8*b* of the contact elements 6, 8. Normally, the underside of the contact device 1 will be printed with soldering paste by means of screen printing before the arrangement shown in FIG. 3 is set together; after the arrangement has been set together, the connection points are heated simultaneously, thereby melting the solder. Due to the large surfaces of sections 6*a*, 8*a*, 8*b*, 6*b*, the subsequent connections points are, when the complete surfaces of these sections are covered with solder, also relatively large and exhibit therefore minimal contact resistance and a large degree of mechanical stability. The large width, especially that of the power contact elements 6, results in minimal inductance of the lead connections and therefore to good signal behavior at high frequencies.

After the electrical connections have been created, the bridges 4, 5, which are now no longer needed to mechanically hold together the contact device 1 and which short switch the contact elements 6, 8, will be severed by means of laser cutting or they will be cut out. Finally, the assembly

Figure 4:
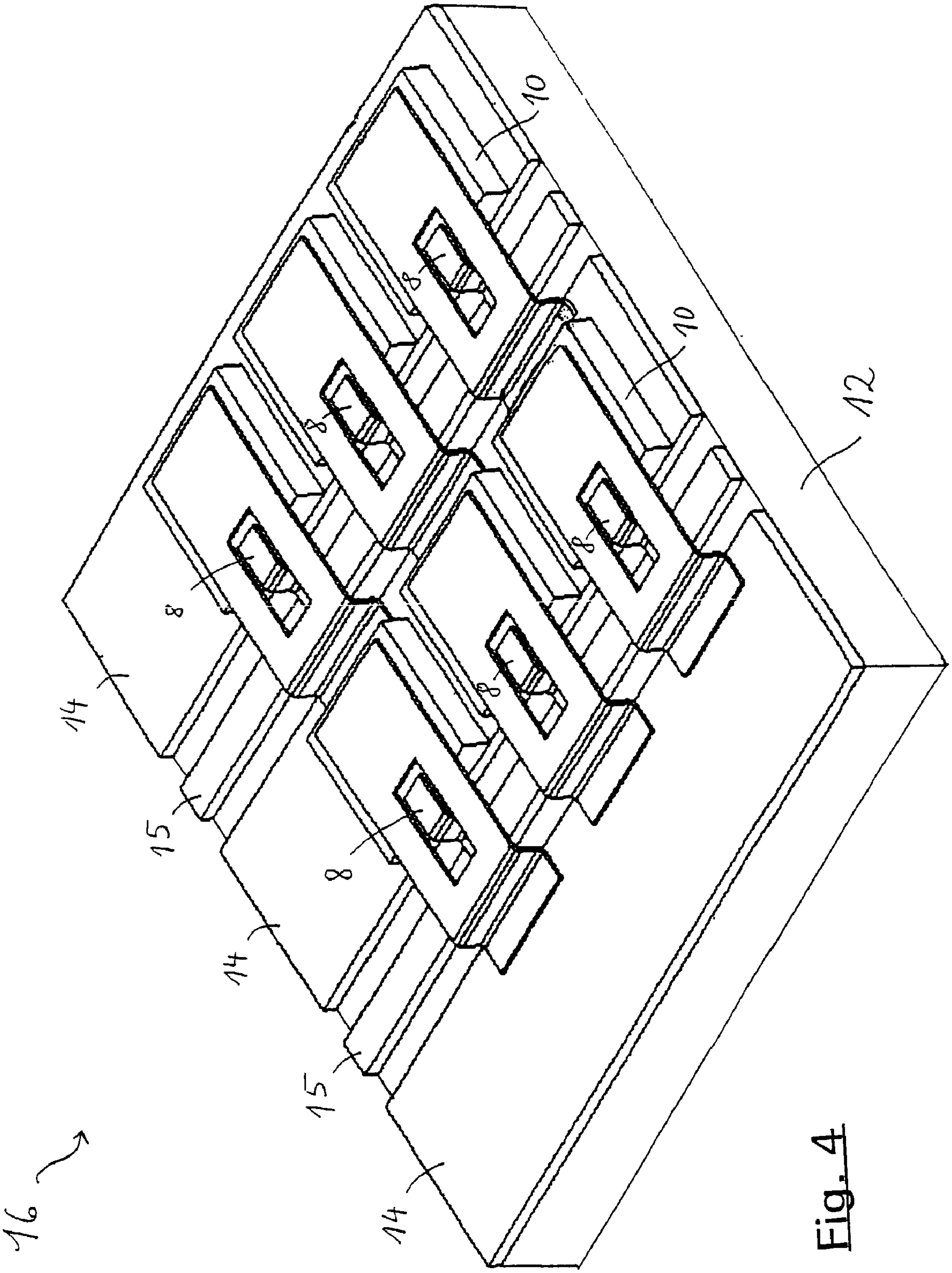
FIG. 4 A perspective view of the assembly shown in FIG. 3, with severed bridges.

16 may be coated with gel or epoxy resin in order to provide protection. FIG. 4 shows the finished assembly 16 with severed bridges 4, 5. In other design examples, (not shown) additional components 10 are set and contacted on the upper side of the contact device 1.

Figure 5:
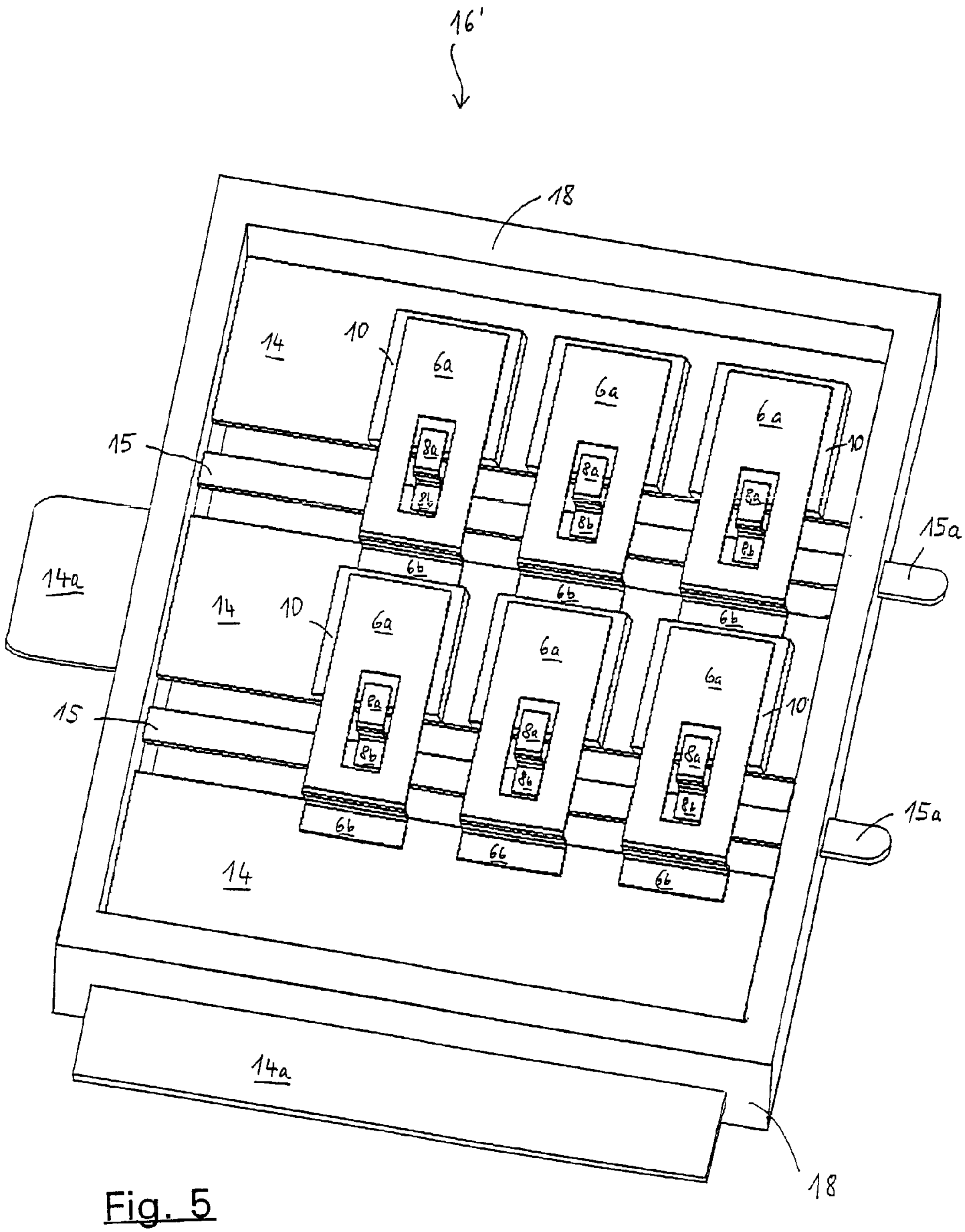
FIG. 5 A perspective view of an assembly according to a second design example.
Figure 6:
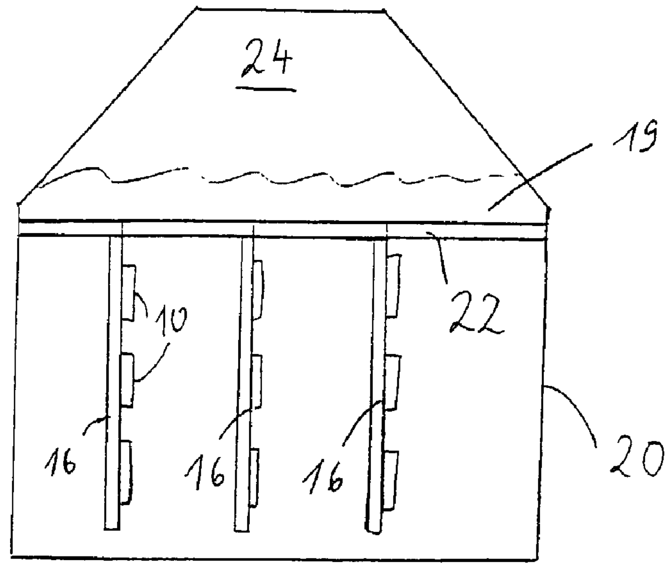
FIG. 6 A schematic depiction of several assemblies hung in a cooling container, according to a second design example.

FIG. 5 shows another design example 16' of the assembly 16 whereby, instead of a ceramic substrate 12, a plastic frame 18 is used as the substrate. This frame is produced as an injection molded piece in which the ends of the strip conductors 14, 15 are inserted, whereby one of the ends of each strip conductor 14, 15 protrudes in the form of a connection pin 14*a*, 15*a* from the side of the plastic frame 18. In this example, the strip conductors are approximately 1 mm to 3 mm thick. In the area of the components 10, the strip conductors 14, 15 hang out freely so that the component 10 can be cooled by means of air or a cooling fluid. To facilitate this, as shown in FIG. 6, the finished assemblies 16' are hung on a holder 22 in a pressure-sealed container 20 filled with cooling medium 19 and the connection pins 14*a*, 15*a* are contacted with corresponding connections in the holder 22. The strip conductors and components 10 are surrounded on all sides by the cooling liquid 19 and can therefore effectively release the dissipated energy to it. As a result, the cooling liquid 19 partially vaporizes and condenses in the upper section 24 of the container 20.

Figure 7:
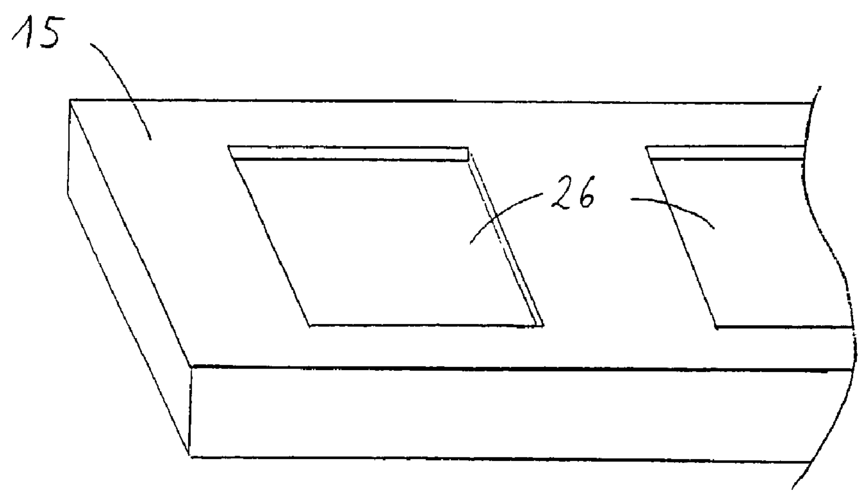
FIG. 7 A perspective view of a strip conductor.
Figure 8:
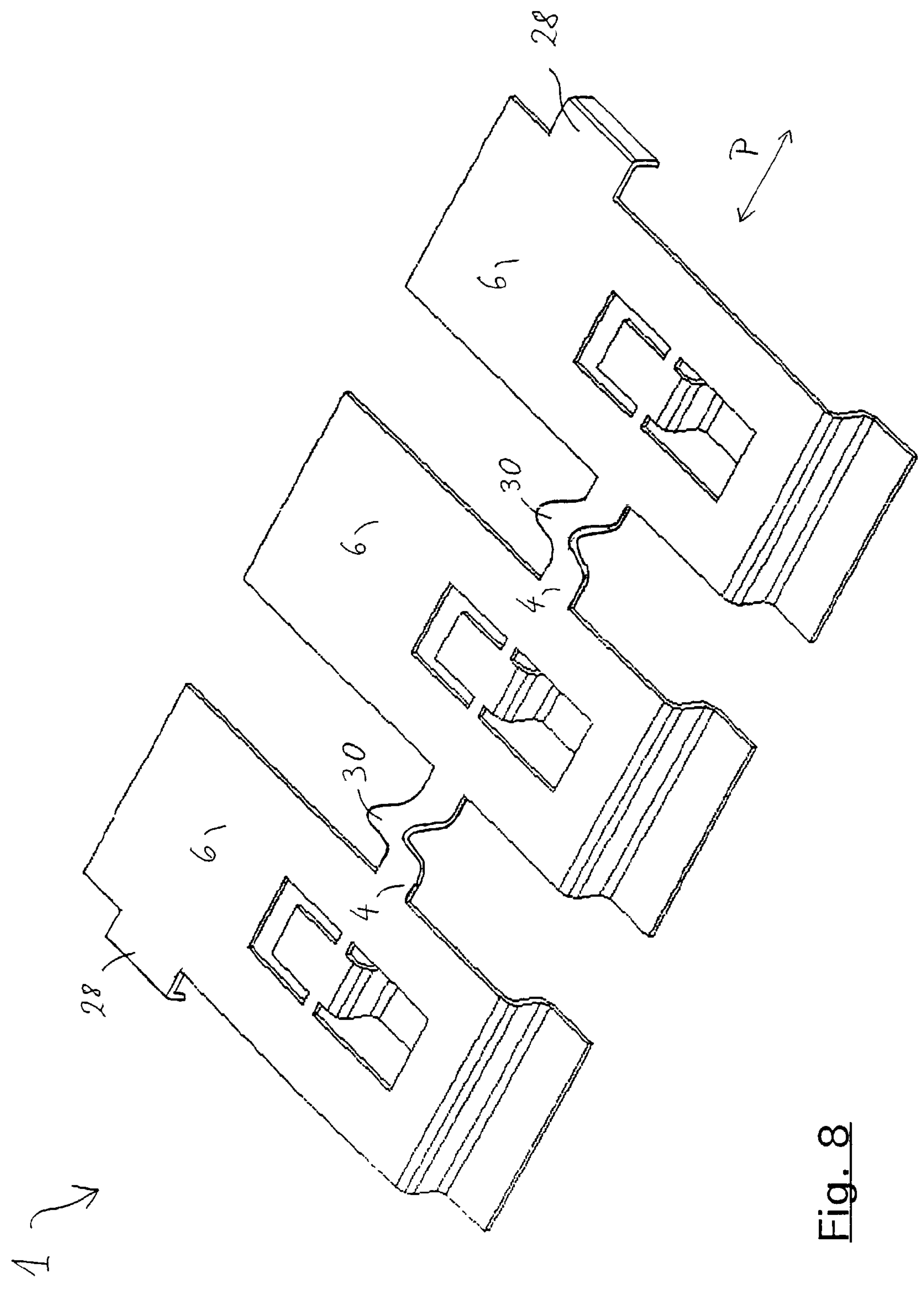
FIG. 8 A perspective view of a contact device according to a second design example.

FIGS. 7 and 8 depict the positioning aids that prevent slippage of the components 10 and the contact device 1, especially during soldering of the connection points 6*a*, 6*b*, 8*a*, 8*b*. FIG. 7 shows a close-up view of an assembly's 16' strip conductor 15. A trough 26 is stamped into the strip conductor 15 at the spot where the component is set and possibly contacted with the strip conductor. The component 10 fits precisely into the trough, preventing lateral slippage of the component. In the case of a strip conductor 15 on a ceramic substrate 12, this type of trough will not be created by means of stamping, but instead by means of printing a painted frame that leaves the component's 10 base surface revealed, thereby creating the surface profile shown in FIG. 7.

FIG. 8 shows an example of the design of the contact device 1 with positioning aids 28, with which the contact device 1 is aligned relative to the component 10 when it set on this. In this case, the positioning aids 28 consist of L-shaped extensions of the contact device 1 that encompass a component 10. In the depicted example, the positioning aids 28 prevent slippage of the contact device in the direction of the arrow P; the use of corresponding positioning aids 28 on the front side of the contact elements 6 (not shown) can achieve effective positioning in the vertical direction as well. Stated differently, combined use of the methods depicted in FIGS. 7 and 8 fastens both the contact device 1 relative to the components 10 and the components 10 relative to the strip conductors 14.

In the case of the contact device 1 shown in FIG. 8, the bridges 4 are also equipped with so-called "relief arches" 30 that fulfill the function of reducing any mechanical stresses that may arise between the individual contact elements 6. This applies to cases when the bridges 4 are not severed after soldering because the contacted components 10 are connected in parallel.

What is claimed:

1. A contact device for contacting one or more power electronic components having strip conductors arranged on a substrate, said contact device comprising at least one flat contact element being adapted to electrically connect a contact surface on a component to one of the strip conductors, said contact device's individual contact elements being connected to each other by bridges adapted to be severed by means of at least one of laser cutting, electron beam cutting, and ion beam cutting, and wherein at least one contact element for a control contact is arranged in a recess of a contact element for a power contact and is connected with this by means of at least one bridge.

2. The contact device of claim 1, being produced from a stamped part or a stamped and bent part.

3. The contact device of claim 1, wherein at least one contact element is adapted in at least one of shape and size to at least one of the shape and size of the contact surface that will be contacted.

4. The contact device of claim 1, being suitable for contacting at least one component with both control and power contacts, wherein a contact element for a control contact has a smaller cross section surface than a contact element for a power contact.

5. The contact device of claim 1, comprising a positioning aid to facilitate positioning of the contact device on at least one of the component(s) and on the substrate.

* * * * *